United States Patent

Hirama

[19]

[11] Patent Number: 5,998,815
[45] Date of Patent: *Dec. 7, 1999

[54] CCD LINEAR SENSOR

[75] Inventor: Masahide Hirama, Kanagawa, Japan

[73] Assignee: Sony Corporation, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/852,270

[22] Filed: May 7, 1997

Related U.S. Application Data

[63] Continuation of application No. 08/332,480, Oct. 31, 1994, abandoned, which is a continuation of application No. 08/112,233, Aug. 27, 1993, abandoned, which is a continuation of application No. 07/907,284, Jul. 1, 1992, abandoned.

[30] Foreign Application Priority Data

Jul. 9, 1991 [JP] Japan .................................. 3-168252

[51] Int. Cl.$^6$ ........................ H01L 27/148; H01L 29/768
[52] U.S. Cl. .......................... 257/234; 257/241; 257/248; 257/250
[58] Field of Search ................... 357/24, 30; 377/57–63; 257/234, 241, 246, 248, 249, 250

[56] References Cited

U.S. PATENT DOCUMENTS

| | | | |
|---|---|---|---|
| 3,943,543 | 3/1976 | Caywood | 257/250 |
| 4,131,950 | 12/1978 | van Santen | |
| 4,389,661 | 6/1983 | Yamada | 357/24 |
| 4,639,940 | 1/1987 | Ohtsuki | 377/60 |
| 4,654,713 | 3/1987 | Boucharlat et al. | |
| 5,164,807 | 11/1992 | Theuwissen | 257/241 |

FOREIGN PATENT DOCUMENTS

| | | |
|---|---|---|
| 58-98961 | 6/1983 | Japan . |
| 60-132363 | 7/1985 | Japan . |

OTHER PUBLICATIONS

IEEE Transactions on Consumer Electronics, vol. 36, No. 3, Aug. 1990 by Hirama et al entitled "A 5000–Pixel Linear Image Sensor With On–Chip Clock Drivers".

*Primary Examiner*—Gene M. Munson
*Attorney, Agent, or Firm*—Hill & Simpson

[57] ABSTRACT

The present invention intends to improve a difference between signal levels of odd-numbered pixels and even-numbered pixels in a CCD (charge coupled device) linear sensor. In a CCD linear sensor comprising a sensor region (1) having an array of a plurality of sensor elements (pixels) ($S_1$), ($S_2$), . . . and first and second horizontal transfer registers (4) and (5) disposed on the respective sides of the sensor region (1) through read-out gate sections (2) and (3) wherein signal charges of every other sensor elements ($S_1$), ($S_3$), ($S_5$), . . . are transferred by the first horizontal transfer register (4) while signal charges of remaining every other sensor elements ($S_2$), ($S_4$), ($S_6$) are transferred by the second horizontal transfer register (5), the first and second horizontal transfer registers (4) and (5) include first and second transfer electrodes ($22R_1$), ($22R_2$) to which two-phase drive pulses ($\phi H_1$) and ($\phi H_2$) are applied, respectively and electrode configurations at the read-out gate section side are formed substantially the same, whereby the capacity of a first transfer section ($HR_1$) to which the drive pulse ($\phi H_1$) is applied is made equal to that of a second transfer section ($HR_2$) to which the drive pulse ($\phi H_2$) is applied.

2 Claims, 4 Drawing Sheets

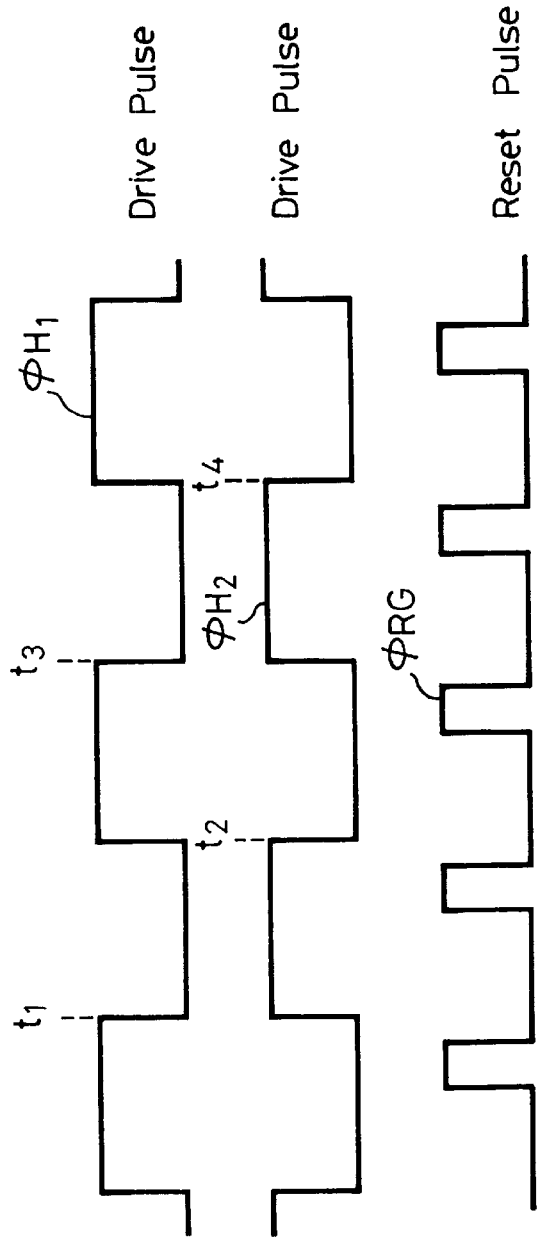
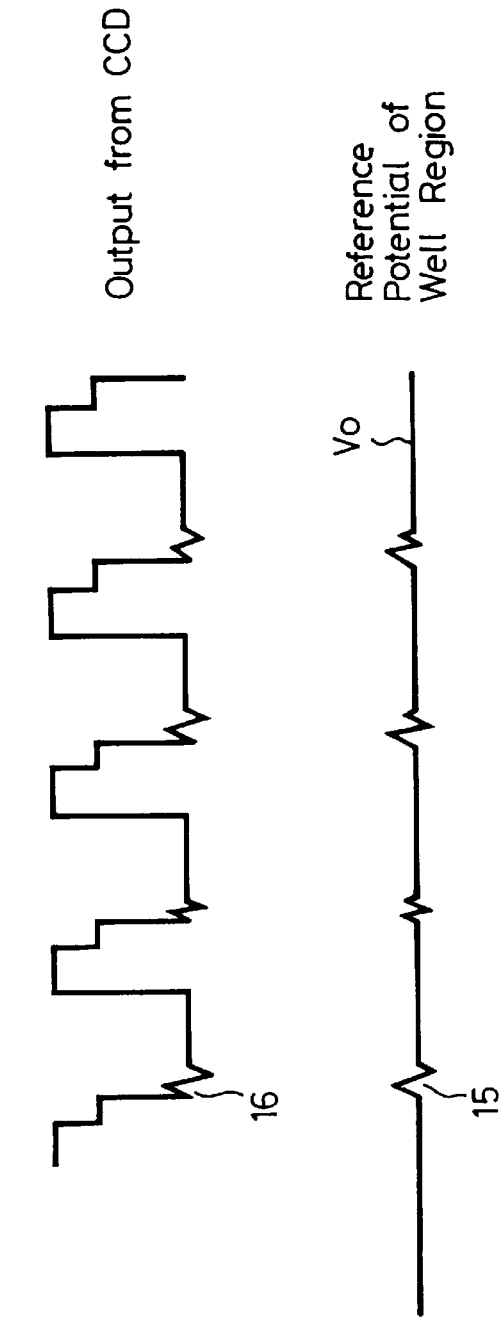
FIG. 2A (PRIOR ART)
FIG. 2B (PRIOR ART)
FIG. 2C (PRIOR ART)
FIG. 2D (PRIOR ART)
FIG. 2E (PRIOR ART)

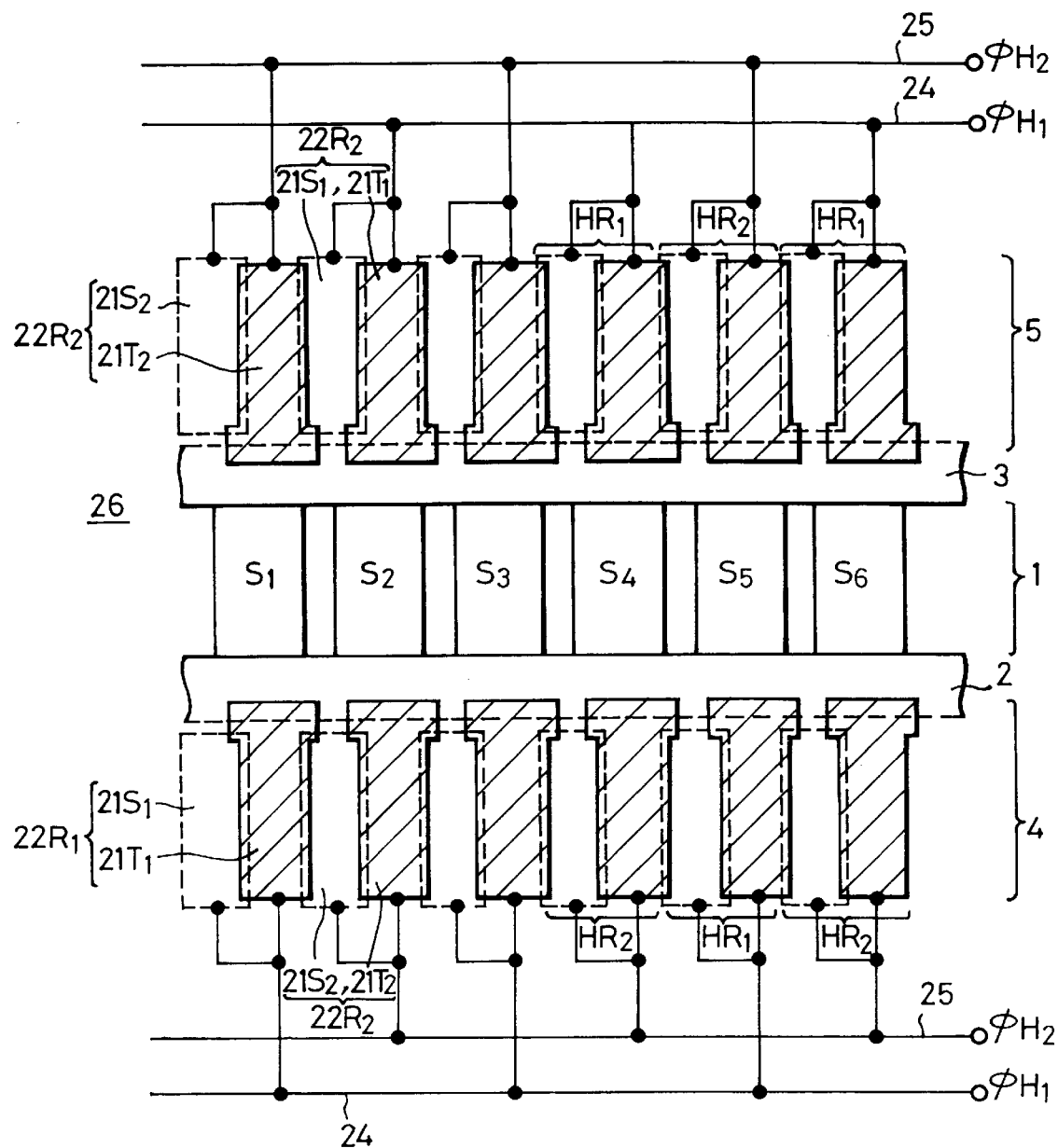

and the drive pulse φH₂ is applied are disposed between the first transfer electrodes 12T₁, and the corresponding storage electrodes 12S₁ and 12S₂ are disposed between the adjacent transfer electrodes 12T₁ and 12T₂.

CCD LINEAR SENSOR

This is a continuation of U.S. patent application Ser. No. 08/332,480 filed Oct. 31, 1994 now abandoned, which is a continuation of U.S. Ser. No. 08/112,233 filed Aug. 27, 1993 which is a continuation of U.S. Ser. No. 07/907,284 filed Jul. 1, 1992, both abandoned.

BACKGROUND OF THE INVENTION

1. Field of the Invention

The present invention generally relates to CCD (charge coupled device) imaging devices and, more particularly, to a CCD linear sensor.

2. Description of the Prior Art

CCD linear sensors transfer signal charges of odd- and even-numbered sensor elements (pixels) through two charge transfer registers, respectively and output the thus transferred signal charges from an output terminal of the final stage in order to improve a resolution.

FIG. 1 of the accompanying drawings shows an overall structure of a conventional CCD linear sensor.

Referring to FIG. 1, first and second horizontal transfer registers 4 and 5 of CCD structure are disposed through read-out gate sections 2 and 3 on both sides of sensor region 1 in which a plurality of sensor elements (pixels) S ($S_1$, $S_2$, $S_3$, . . . ) are arrayed in one direction, whereby signal charges of the odd-numbered sensor elements $S_1$, $S_3$, $S_5$, . . . are read out to the first horizontal transfer register 4 while signal charges of the even-numbered sensor elements $S_2$, $S_4$, $S_6$, . . . are read out to the second horizontal transfer register 5. Then, the respective signal charges are transferred in one direction by two-phase drive pulses φH₁ and φH₂ shown in FIGS. 2A and 2B. Transfer sections HR₁ and HR₂ of the final stages of the first and second horizontal transfer registers 4 and 5 are connected to a floating diffusion region 7 through a common horizontal output gate section 6 to which there is applied a gate voltage $V_{HOG}$. Then, signal charges from the first and second horizontal transfer registers 4 and 5 are alternately transferred to the floating diffusion region 7, whereby they are converted into signal voltages and signals corresponding to the odd-numbered and even-numbered pixels which are alternately output from an output amplifier 8 as shown in a waveform of an output of the CCD. In the output section, the signal charges transferred to the floating diffusion region 7 are sequentially drained out through a reset gate section 9 to a reset drain region 10 by a reset pulse φRG which is higher in frequency than the drive pulses φH₁ and φH₂ as shown in FIG. 2C.

FIG. 3 of the accompanying drawings shows an enlarged plan view of the conventional first and second horizontal transfer registers 4 and 5. The first and second horizontal transfer registers 4 and 5 respectively comprise a plurality of transfer sections HR (HR₁, HR₂) having transfer electrodes 13R (13R₁, 13R₂), each having a set of storage electrodes 12S (12S₁, 12S₂) made of a polycrystalline silicon first layer and transfer electrodes 12T (12T₁, 12T₂) made of a polycrystalline silicon second layer. The drive pulse φH₁ is applied to every other one of the transfer electrodes 13R₁ and the drive pulse φH₂ is applied to remaining every other one of the transfer electrodes 13R₂. When signal charges of the sensor elements S are read out to the first and second horizontal transfer registers 4 and 5, the signal charges are read out to the region (so-called storage section) of the first storage electrode 12S₁ through the region (so-called transfer section) of the first transfer electrode 12T₁ to which the drive pulse φH₁ is applied.

Hence, as shown in FIG. 3, the first transfer electrodes 12T₁ to which the drive pulse φH₁ is applied are shaped as a comb whose respective one ends are coupled continuously. The coupled portions thereof are provided so as to overlap the read-out gate sections 2 and 3. On the other hand, the second transfer electrodes 12T₂ to which the drive pulse φH₂ is applied are disposed between the first transfer electrodes 12T₁, and the corresponding storage electrodes 12S₁ and 12S₂ are disposed between the adjacent transfer electrodes 12T₁ and 12T₂.

In the above-mentioned CCD linear sensor, since the pattern configurations of the first and second transfer electrodes 12T₁ and 12T₂ are different, the first and second transfer electrodes 13R₁ and 13R₂ in the horizontal transfer registers 4 and 5 are different in area. As a result, the capacity of the first transfer section HR₁ to which the drive pulse φH₁ is applied and that of the second transfer section HR₂ to which the drive pulse φH₂ is applied are not equal to each other, thereby a difference is produced between the signal level of the odd-numbered pixel (sensor element) and that of the even-numbered pixel (sensor element).

More specifically, in the output section, the floating diffusion region 7 is formed within the well region, and the well region is interconnected to the ground. In that case, however, the capacities of the transfer sections HR₁ and HR₂ are large so that, when the horizontal transfer registers 4 and 5 are driven by the two-phase drive pulses φH₁ and φH₂, a potential (known as "reference potential") Vo of the well region momentarily fluctuates at the negative-going edges $t_1$, $t_2$, $t_3$, . . . of the drive pulse φH₁ or φH₂ which is used to transfer the signal charge to the floating diffusion region 7, as shown in FIG. 2. As a result, a noise component 16 is mixed into the output signal due to the fluctuation component 15. If the fluctuation component 15 of the potential Vo in the well region are the same, then no problem will occur. However, since the first and second transfer sections HR₁ and HR₂ are different in capacities, the output signal has different noise components 16, thereby causing a difference (so-called DC level difference) to occur between the signal level of the odd-numbered pixel and that of the even-numbered pixel.

This signal level difference becomes conspicuous as the CCD linear sensor is increased in resolution. Hence, this signal level difference must be corrected at every pixel.

OBJECTS AND SUMMARY OF THE INVENTION

Accordingly, it is an object of the present invention to provide a CCD (charge coupled device) linear sensor in which the aforesaid shortcomings and disadvantages encountered with the prior art can be eliminated.

More specifically, it is an object of the present invention to provide a CCD linear sensor which can improve the output signal levels.

Another object of the present invention is to provide a CCD linear sensor which can provide an image quality of high resolution without correcting a black signal.

As an aspect of the present invention, there is provided a solid state imaging device which comprises a sensor region formed of a plurality of sensor elements arrayed in one direction, and first and second charge transfer shift registers disposed on respective sides of the sensor region through first and second read-out gate sections, the first charge transfer shift register having first and second transfer electrodes to which two-phase drive pulses are applied and transferring signal charges of every other sensor elements in the plurality of sensor elements, and the second charge transfer shift register having third and fourth transfer electrodes to which the two-phase drive pulses are applied and transferring signal charges of the remaining every other sensor elements in the plurality of sensor elements, wherein the electrode configurations of the first and second transfer electrodes at the side of the first read-out gate section are formed substantially the same, and the electrode configurations of the third and fourth transfer electrodes at the side of the second read-out section are formed substantially the same.

Therefore, the difference between the signal level corresponding to the odd-numbered pixel and the signal level corresponding to the even-numbered pixel can be decreased and hence the image quality of high resolution can be obtained without correcting a black signal.

The above and other objects, features, and advantages of the present invention will become apparent from the following detailed description of an illustrative embodiment thereof to be read in conjunction with the accompanying drawings, in which like reference numerals are used to identify the same or similar parts in the several views.

BRIEF DESCRIPTION OF THE DRAWINGS

FIGS. 2A through 2E are respectively waveform diagrams of drives pulses, a reset pulse, an output of CCD and a reference potential to which references will be made in explaining the conventional CCD linear sensor according to the prior art;

FIG. 4 is a fragmentary, enlarged plan view illustrating a main portion of a CCD linear sensor according to an embodiment of the present invention.

DETAILED DESCRIPTION OF THE PREFERRED EMBODIMENT

Figure 1:
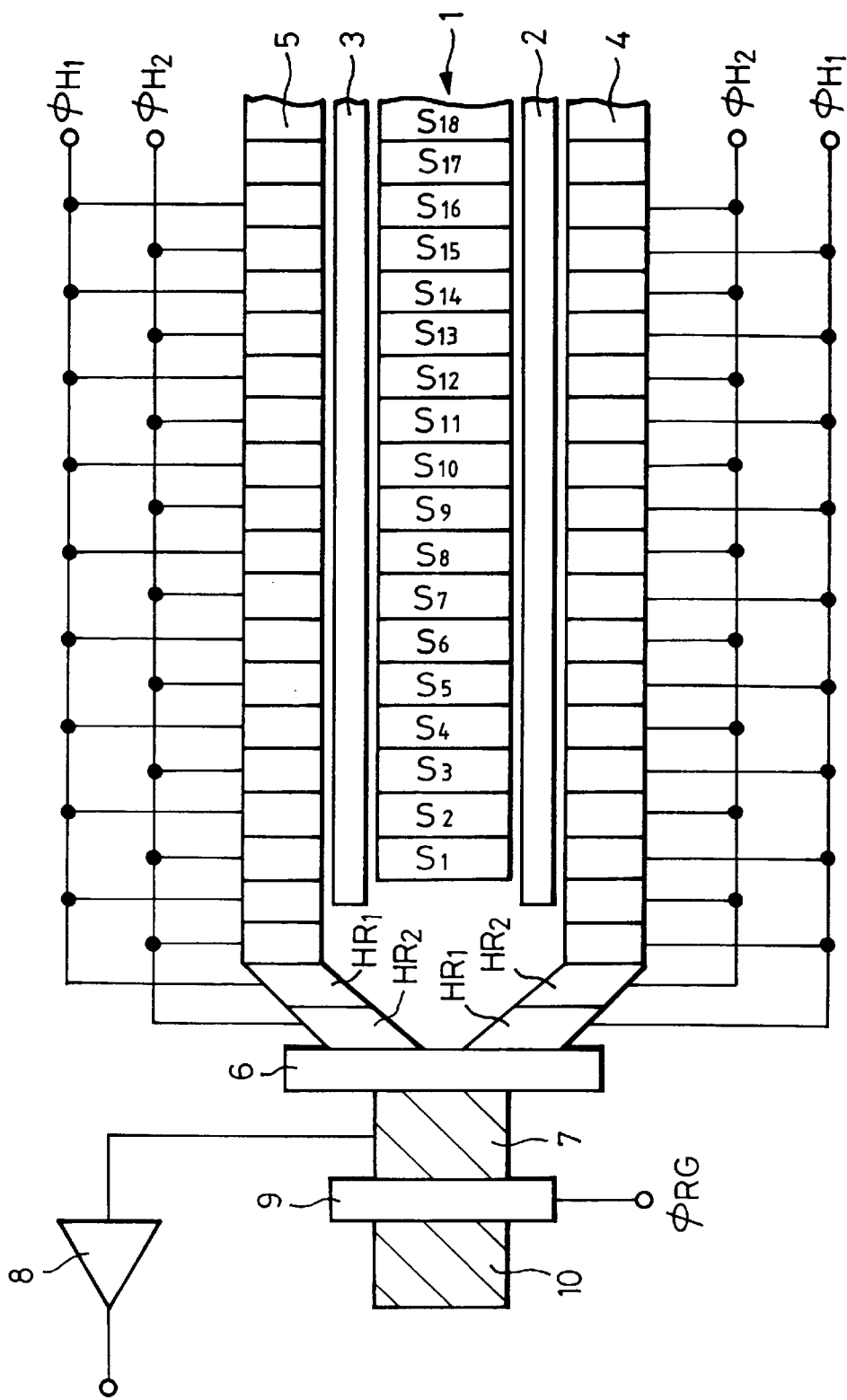
FIG. 1 is a diagram showing a whole structure of a CCD linear sensor according to the prior art.
Figure 3:
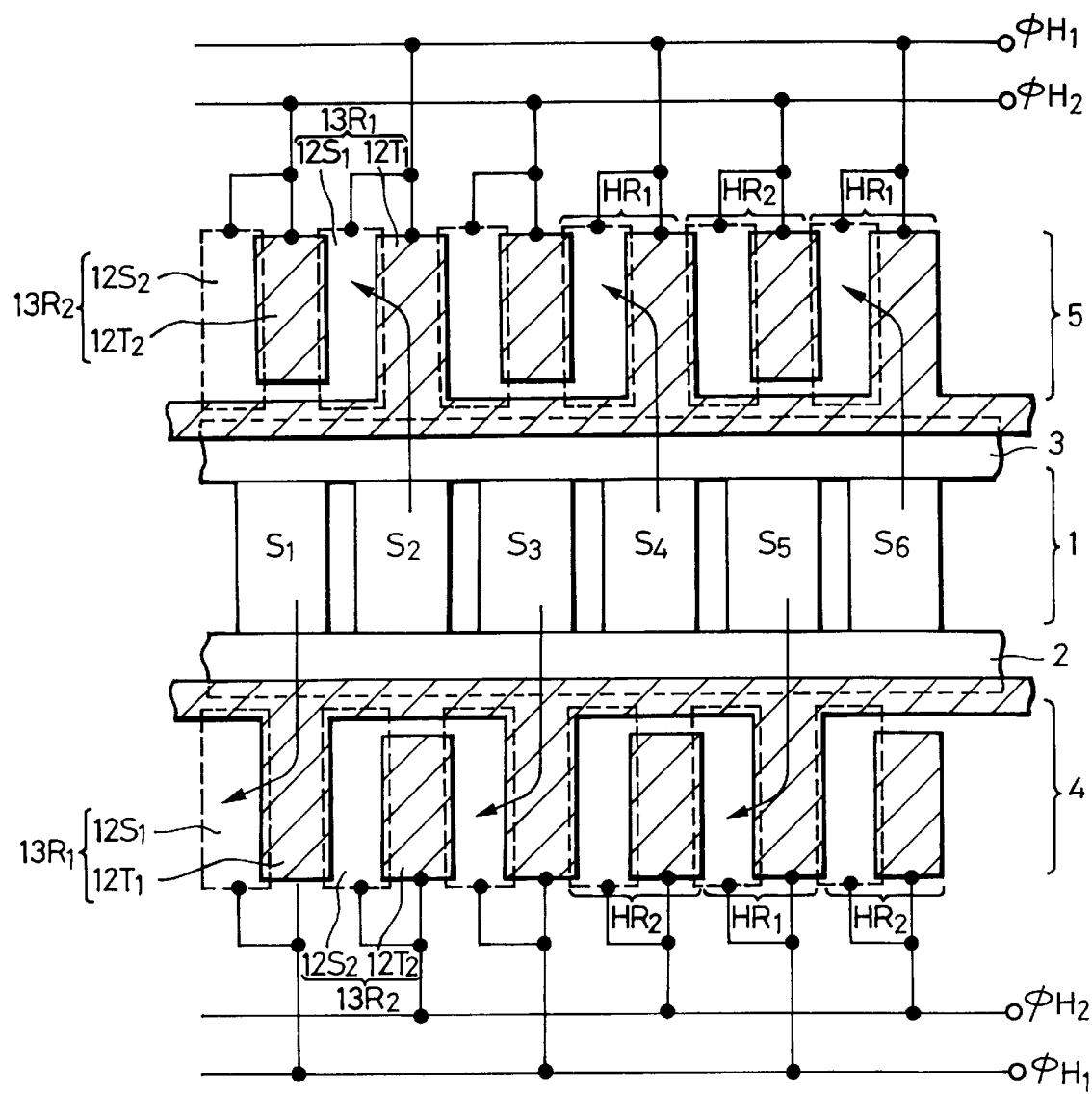
FIG. 3 is a fragmentary, enlarged plan view of a main portion of a CCD linear sensor according to the prior art.

A CCD linear sensor according to an embodiment of the present invention will now be described with reference to FIG. 4.

FIG. 4 of the accompanying drawings shows a main portion of the CCD linear sensor according to an embodiment of the present invention.

Referring to FIG. 4, a sensor region depicted by reference numeral 1 is formed of an array of a plurality of sensor elements S ($S_1$, $S_2$, . . . ). First and second horizontal transfer registers 4 and 5, each of which is formed of a CCD, are respectively disposed on the respective sides of the sensor region 1 through read-out gate portions 2 and 3 in parallel to the sensor region 1. The first and second horizontal transfer registers 4 and 5 are respectively formed of a plurality of transfer sections HR ($HR_1$, $HR_2$) which are composed of sets of storage electrodes 21S ($21S_1$, $21S_2$) made of a polycrystalline silicon first layer and transfer electrodes 21T ($21T_1$, $21T_2$) made of a polycrystalline silicon second layer. Every other first transfer electrodes $22R_1$ are coupled to a bus line 24 to which the drive pulse $\phi H_1$ is applied, while remaining every other second transfer electrodes $22R_2$ are coupled to a bus line 25 to which the drive pulse $\phi H_2$ is applied.

The first transfer sections $HR_1$ of the first horizontal transfer register 4 and to which the drive pulse $\phi H_1$ is applied are formed in association with, for example, odd-numbered sensor elements $S_1$, $S_3$, $S_5$, . . . of the sensor region 1, while the first transfer sections $HR_1$ of the second horizontal transfer register 5 and to which the drive pulse $\phi H_1$ is applied are formed in association with, for example, even-numbered sensor elements $S_2$, $S_4$, $S_6$, . . .

According to this embodiment, the first transfer electrode $21T_1$ to which the drive pulse $\phi H_1$ is applied and the second transfer electrode $21T_2$ to which the drive pulse $\phi H_2$ is applied are arranged in the same electrode configuration including the configurations at the sides of the read-out gate sections 2 and 3. Parts of the respective transfer electrodes $21T_1$ and $21T_2$ are formed so as to overlap the corresponding read-out gate sections 2 and 3, and storage electrodes $21S_1$ and $21S_2$ of the same electrode configuration are respectively formed between adjacent transfer electrodes $21T_1$ and $21T_2$.

Though not shown, channel stop regions are formed between the respective sensor elements $S_1$, $S_2$, $S_3$, . . . and the second transfer section $HR_2$ in such a fashion that signal charges of the sensor elements $S_1$, $S_2$, $S_3$, . . . are read out to the first transfer sections $HR_1$ of the corresponding horizontal transfer registers 4 and 5 to which the drive pulse $\phi H_1$ is applied and are not transferred to the second transfer sections $HR_2$ to which the drive pulse $\phi H_2$ is applied.

When the bus line 24 to which the drive pulse $\phi H_1$ is applied is disposed in the outside and the bus line 25 to which the drive pulse $\phi H_2$ is applied is disposed in the inside at the side of the first horizontal transfer register 4, the bus line 24 to which the drive pulse $\phi H_1$ is applied is disposed in the inside and the bus line 25 to which the drive pulse $\phi H_2$ is applied is disposed in the outside at the side of the second horizontal transfer register 5.

In this CCD linear sensor 26, similarly as described above, signal charges of the odd-numbered sensor elements $S_1$, $S_3$, $S_5$, . . . are read out through the read-out gate section 2 to the underside of the storage electrode $21S_1$ of each first transfer section $HR_1$ of the first horizontal transfer register 4, while signal charges of the even-numbered sensor elements $S_2$, $S_4$, $S_6$, . . . are read out through the read-out gate section 3 to the underside of the storage electrode $21S_2$ of each first transfer section $HR_1$ of the second horizontal transfer register 5. Then, respective signal charges are transferred in one direction within the first and second horizontal transfer registers 4 and 5 and charge-voltage-converted in the floating diffusion region 7 in the output section having a similar structure to that of FIG. 1, whereafter it is output from the output amplifier 8.

According to the embodiment of the present invention, since the first transfer electrode $21T_1$ to which the drive pulse $\phi H_1$ is applied is divided so as to correspond to each first transfer section $HR_1$, the electrode configuration of the second transfer electrode $21T_2$ to which the drive pulse $\phi H_2$ is applied is formed substantially the same as that of the first transfer electrode $21T_1$, and the second transfer electrode $21T_2$ is formed so as to overlap the read-out gate sections 2 and 3 similarly to the first transfer electrode $21T_1$, the areas of the first and second transfer electrodes $22R_1$ and $22R_2$ can be made equal to each other, and the capacitances of the first and second transfer sections $HR_1$ and $HR_2$ can be made equal to each other. Consequently, the fluctuation components 15 of the potential (reference potential Vo of the well region at negative-going timing points $t_1$, $t_2$, $t_3$, . . . of the drive pulse $\phi H_1$ or $\phi H_2$ become substantially equal, and the noise component 16 applied to the respective signals of the odd-numbered and even-numbered pixels become uniform. Therefore, a difference between the signal levels of the odd-numbered and even-numbered pixels can be improved, and the image quality of high resolution can be obtained without correcting a black signal.

While the signal charges of the first and second horizontal transfer registers 4 and 5 are alternately transferred to and mixed together in the floating diffusion region 7 as described above, the present invention is not limited thereto, and a variant is also possible. That is, a transfer section of several bits may be disposed at the front stage of the floating diffusion. region 7, and signal charges from the first and second horizontal transfer registers 4 and 5 are alternately transferred to this transfer section of several bits, in which they are mixed together.

According to the CCD imaging device, i.e., CCD linear sensor of the present invention, a difference between the signal level corresponding to the odd-numbered pixel and the signal level corresponding to the even-numbered pixel can be improved and hence, the image quality of high resolution can be obtained without correcting the black signal.

Having described a preferred embodiment of the invention with reference to the accompanying drawings, it is to be understood that the invention is not limited to that precise embodiment and that various changes and modifications could be effected by one skilled in the art without departing from the spirit or scope of the invention as defined in the appended claims.

What is claimed is:

1. A CCD linear sensor, comprising:

a linear sensor having odd and even numbered sensor elements arranged in alternation;

a first read-out gate section adjacent a first side of said linear sensor;

a first horizontal transfer register on said first side of said linear sensor and adjacent said first read-out gate section on a side of said first read-out gate section opposite said linear sensor, said first horizontal transfer register including:

first transfer sections associated with said odd numbered sensor elements of said linear sensor, each of said first transfer sections including:
a storage electrode, and
a transfer electrode, second transfer sections associated with said even numbered sensor elements of said linear sensor, each of said second transfer sections including:
a storage electrode, and
a transfer electrode of a same size and configuration as said transfer electrode of said first transfer section of said first horizontal transfer register so that capacitances of said transfer electrodes of said first and second transfer regions are equal to each other, said transfer electrodes of said first and second transfer sections of said first horizontal transfer register overlapping said first read-out gate section;

channel stop regions between said second transfer sections of said first horizontal transfer register and said first read-out gate section;

a first bus line at said first side of said linear sensor connected to carry first drive pulses to said first transfer sections of said first horizontal transfer register;

a second bus line at said first side of said linear sensor connected to carry second drive pulses to said second transfer sections of said first horizontal transfer register;

a second read-out gate section adjacent a second side of said linear sensor;

a second horizontal transfer register on said second side of said linear sensor and adjacent said second read-out gate section on a side of said second read-out gate section opposite said linear sensor, said second horizontal transfer register including:

first transfer sections associated with said even numbered sensor elements of said linear sensor, each of said first transfer sections including:
a storage electrode, and
a transfer electrode, second transfer sections associated with said odd numbered sensor elements of said linear sensor, each of said second transfer sections including:
a storage electrode, and
a transfer electrode of a same size and configuration as said transfer electrode of said first transfer section of said second horizontal transfer register so that capacitances of said transfer electrodes of said first and second transfer regions are equal to each other;

said transfer electrodes of said first and second transfer sections of said second horizontal transfer register overlapping said second read-out gate section;

channel stop regions between said second transfer sections of said second horizontal transfer register and said second read-out gate section;

a first bus line at said second side of said linear sensor connected to carry first drive pulses to said first transfer sections of said second horizontal transfer register; and a second bus line at said second side of said linear sensor connected to carry second drive pulses to said second transfer sections of said second horizontal transfer register.

2. A CCD linear sensor as claimed in claim 1, where said transfer electrodes of said first and second transfer sections of said first horizontal transfer register said transfer electrodes of said first and second transfer sections of said second horizontal transfer register all being of a T shape, with a crossbar of said T overlapping respective ones of said first and second read-out gate sections.

* * * * *